United States Patent
Bierman

(10) Patent No.: US 9,372,221 B1
(45) Date of Patent: Jun. 21, 2016

(54) PARTIAL DISCHARGE SIGNAL NORMALIZATION

(71) Applicant: Adam Bierman, Fort Collins, CO (US)

(72) Inventor: Adam Bierman, Fort Collins, CO (US)

(73) Assignee: AKTIEBOLAGET SKF, Gothenburg (SE)

( * ) Notice: Subject to any disclaimer, the term of this patent is extended or adjusted under 35 U.S.C. 154(b) by 0 days.

(21) Appl. No.: 14/838,884

(22) Filed: Aug. 28, 2015

(51) Int. Cl.
*H03K 19/00* (2006.01)
*H03K 19/173* (2006.01)
*G01R 31/14* (2006.01)
*H03K 19/177* (2006.01)
*G01R 31/12* (2006.01)

(52) U.S. Cl.
CPC ............ *G01R 31/14* (2013.01); *G01R 31/1245* (2013.01); *H03K 19/17764* (2013.01)

(58) Field of Classification Search
CPC ............... G01R 31/14; G01R 31/1245; H03K 19/17764

USPC .................. 326/16, 37, 38; 324/76.28, 76.16, 324/76.39; 361/78, 86

See application file for complete search history.

(56) References Cited

U.S. PATENT DOCUMENTS

2008/0203977 A1* 8/2008 Raimar .................... G06F 1/26 320/166

* cited by examiner

*Primary Examiner* — Daniel D Chang
(74) *Attorney, Agent, or Firm* — Mark Ussai; SKF USA Inc. Patent Dept.

(57) ABSTRACT

The disclosure herein relates to a field-programmable gate array for detecting and normalizing partial discharges in a digital signal. The field-programmable gate array includes a filter that receives the digital signal and isolates high frequency information from the digital signal. The field-programmable gate array then normalizes the high frequency information by a compensation value to produce a normalized signal. Further, a comparator of the field-programmable gate array can determine whether the normalized signal exceeds a threshold input. In turn, a counter of the field-programmable gate array increments a counter value in response to each determination that the high frequency information exceeds the threshold input.

20 Claims, 3 Drawing Sheets

PARTIAL DISCHARGE SIGNAL NORMALIZATION

BACKGROUND

Partial discharge is a localized dielectric breakdown of a portion of an electrical insulation system of a device (e.g., a motor) under high voltage stress. The localized dielectric breakdown can be caused by one or more cracks, voids, or inclusions in the insulation system. A partial discharge can cause damage to the device and indicates that the insulation system is failing, which may further lead to catastrophic damage to the device. Thus, it is desirable to detect partial discharges so that the insulation system may be repaired or replaced before any damage to the device.

SUMMARY

Embodiments herein relate to a field-programmable gate array for detecting and normalizing partial discharges in a digital signal. The field-programmable gate array includes a filter that receives the digital signal and isolates high frequency information from the digital signal. The field-programmable gate array then normalizes the high frequency information by a compensation value to produce a normalized signal. Further, a comparator of the field-programmable gate array can determine whether the normalized signal exceeds a threshold input. In turn, a counter of the field-programmable gate array increments a counter value in response to each determination that the high frequency information exceeds the threshold input.

Additional features and advantages are realized through the techniques of the present disclosure. Other embodiments and aspects of the disclosure are described in detail herein. For a better understanding of the disclosure with the advantages and the features, refer to the description and to the drawings.

BRIEF DESCRIPTION OF THE DRAWINGS

The subject matter that is regarded as the invention is particularly pointed out and distinctly claimed in the claims at the conclusion of the specification. The foregoing and other features, and advantages of the invention are apparent from the following detailed description taken in conjunction with the accompanying drawings in which:

DETAILED DESCRIPTION

Embodiments described herein relate to partial discharge signal normalization. More particularly, embodiments described herein can relate to digital signal normalization for partial discharge analysis across multiple voltage dividers/attenuation configurations.

Partial discharge detection is a difficult measurement to perform in a consistent manner across varying devices because of differences in a host measuring unit and strength of a stimulating surge impulse. In addition, different detection operations for the varying devices yield different results based on the signal frequencies being captured and analyzed. For example, contemporary detection methods utilizing antennas, hard-wired coupling capacitors, or hard-wired current transformers fail to show consistent results across multiple devices, as antennas are directionality dependent for emission pick-up and hard-wired coupling capacitors or current transformers include defined frequency parameters that eliminate a large amount of signal information prior to analysis.

Embodiments described herein institute a compensation heuristic that tunes values of a partial discharge from a reflective waveform so that different host units with the partial discharge feature will display approximately the same results regardless of a configuration or maximum voltage of a particular host unit. In turn, different host units can test the same device (e.g., coil) without a loss in information integrity regarding the levels of inception and extinction as well as the severity of the partial discharges the test unit is experiencing.

It will be appreciated that embodiments described herein will enable a setting of compensation on different host units testing a known load so that different host controllers can display the same values for the partial discharge information received. This normalization also allows for variability in an attenuation circuit to cut down costs and material expenses for lower voltage applications or applications where both 15 kV and lower voltage host units are testing the same coils.

Figure 1:
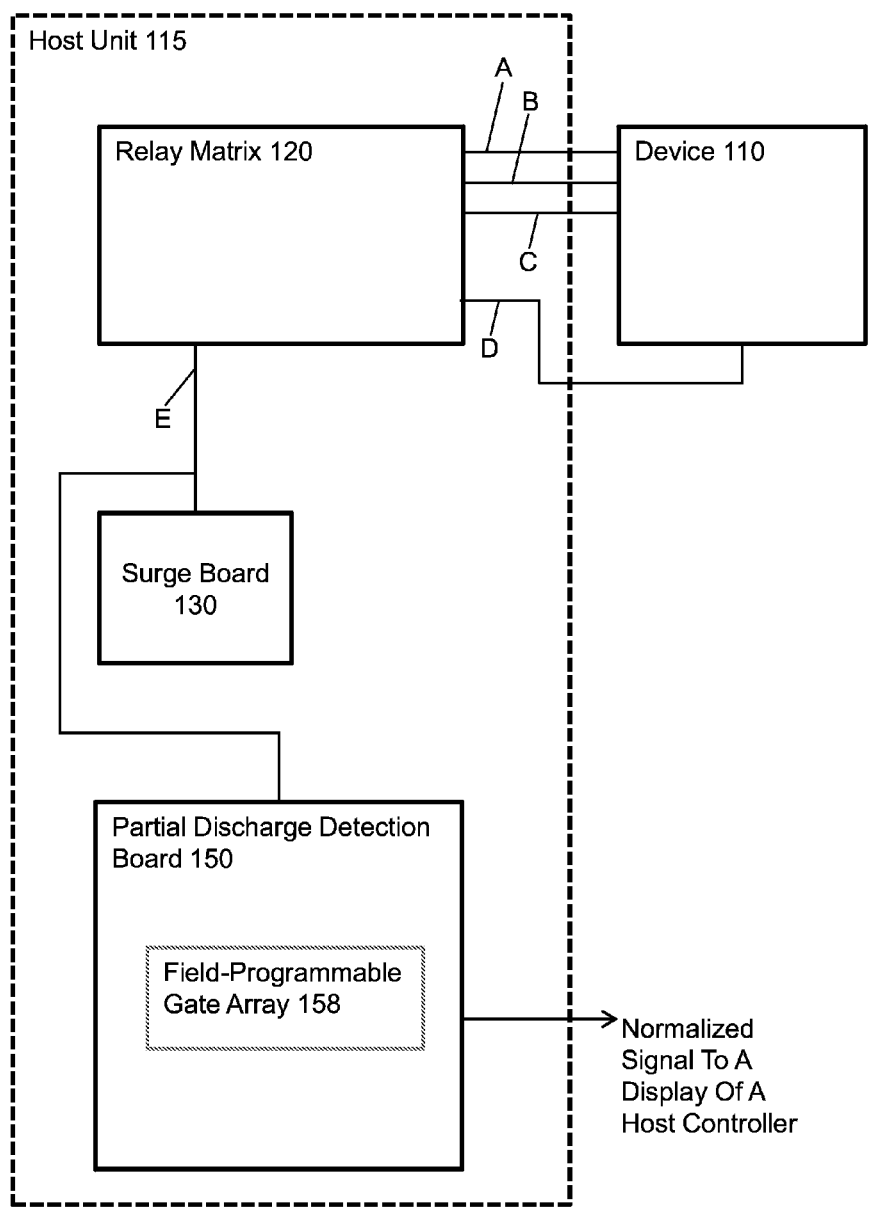
FIG. 1 is a schematic view of a system for detecting a partial discharge according to an embodiment of the present invention.

Turning now to FIG. 1, a schematic view of a system 100 for detecting a partial discharge according to an embodiment of the present invention is generally shown to include a device 110 and a host unit 115.

The device 110 is a component under test for partial discharges including an electrical insulation. An example of the device 110 is a motor stator. Motor stators, in application, can be used in locomotive engines, power plants, generators, etc. Motor stators can be configured as an open frame or as an encased design, with a rotor installed or not installed. For instance, the motor stator can include a form wound coil where the coils are formed, dipped, and insulated before being inserted into the slots of the motor stator and connected on the ends. Testing motor (i.e., testing for partial discharges) may generally be performed with respect to manufacturing or repairing of the motor stators. Further, testing can be performed on the individual coils of the motor stator or the entire device 110.

The host unit 115 is a testing component configured to perform offline partial discharge testing of the device 110. The host unit 115 includes a relay matrix 120, a surge board 130, and a partial discharge detection board 150. The host unit 115 utilizes high voltage wires to connect to the device, as illustrated by test leads A, B, C and a line side connection D (a ground connection). Additionally, the elements of the host unit 115 are connected internally, for example, by a line connection E.

In operation, the host unit 115 applies a surge impulse to the device 110 while the device 110 is offline (e.g., applies the surge impulse through one of the test leads A, B, or C, while the remaining two leads are grounded to line side connection D). The surge impulse can include a voltage from 0 kV to 15 kV, that can be stored and discharged from a capacitor. In one example, a surge impulse of 15 kV can be reached in less than or equal to 100 ns). The application of the surge impulse results in a reflective waveform that is received from the device 110 by the host unit 115 through the test lead A, B, or C that provided the impulse.

The reflective waveform, which in one example is a damped sinusoid, includes the partial discharges generated by the surge impulse. That is, the reflective waveform can include a spike voltage that corresponds to the peak voltage of the surge impulse followed by ring voltages. Partial discharges can be detected within the spike voltage. Further, the ring voltages can also include subsequent spike voltages in which subsequent partial discharges can be detected. Note that the ring voltages are responsive to the peak voltage and can last hundreds of microseconds, which is comparatively longer than the peak voltage, depending on the device 110.

The relay matrix 120 is an element of the host unit 115 that includes one or more relays. The relay matrix 120 is configured to switch between test leads A, B, C to connect to the device 110. For example, as shown in FIG. 1, the relay matrix 120 can switch between three test leads A, B, C to account for the three electrical phases of the device 110. The test leads A, B, C can include alligator clips that attach directly to terminals of the device 110 and the host unit 115. In the case of the form wound coil, the test leads can be attached directly to the coils themselves. Note that, while physically attached to both the device 110 and host unit 115, the test leads are electrically connected individually (e.g., one at a time) to the device 110 by the relay matrix 120, such that the surge impulse arrives at the device 110 through a single path. The relay matrix 120 is also the receiving point for the line side connection D, which is a ground a connection. In operation, any reflective waveforms resulting from the surge impulse, regardless of which test lead A, B, or C is active, is received by the relay matrix 120 via that same test lead. In this way, the relay matrix 120 can supply the reflective waveform to the partial discharge detection board 150 via the line connection E.

The surge board 130 is an element of the host unit 115 configured to apply the surge impulse to the device 110 (e.g., via the line connection E, the relay matrix 120, and the connected test lead A, B, or C). The surge board 130, in some embodiments, can include a high voltage capacitor that is charged by a high voltage power supply. The surge board 130 can also include a high voltage stack that triggers the high voltage capacitor. For example, once the high voltage capacitor is fully charged to the peak voltage by the high voltage power supply, the high voltage stack triggers the high voltage capacitor to quickly discharge through the line connection E, the relay matrix 120, and the connected test lead A, B, or C to the device 110, thereby delivering the surge impulse. As noted above, the surge impulse results in the reflective waveform that travels through the connected test lead A, B, or C, the relay matrix 120, and the line connection E to the partial discharge detection board 150.

The partial discharge detection board 150 is a component of the host unit 115 configured to receive and processes the reflective waveform to detect partial discharges. The partial discharge detection board 150 can include a field-programmable gate array 158. The field-programmable gate array 158 is an integrated circuit configurable via an array of programmable logic blocks, and a hierarchy of reconfigurable interconnects that allow the array of programmable logic blocks to be "wired together." For example, the field-programmable gate array 158 can be configured to include a compensation heuristic that tunes values of partial discharges within the reflective waveform. In general, the compensation heuristic can be loaded into a field-programmable gate array of different host units to enable the setting of compensation (e.g., enable normalization of the partial discharge signals) for testing a device 110. The partial discharge detection board 150 can also include one or more resistors that form a voltage divider (e.g., a resistor divider), one or more operational amplifiers, and a bus interconnecting each of these items to each other and a microcontroller.

Figure 2:
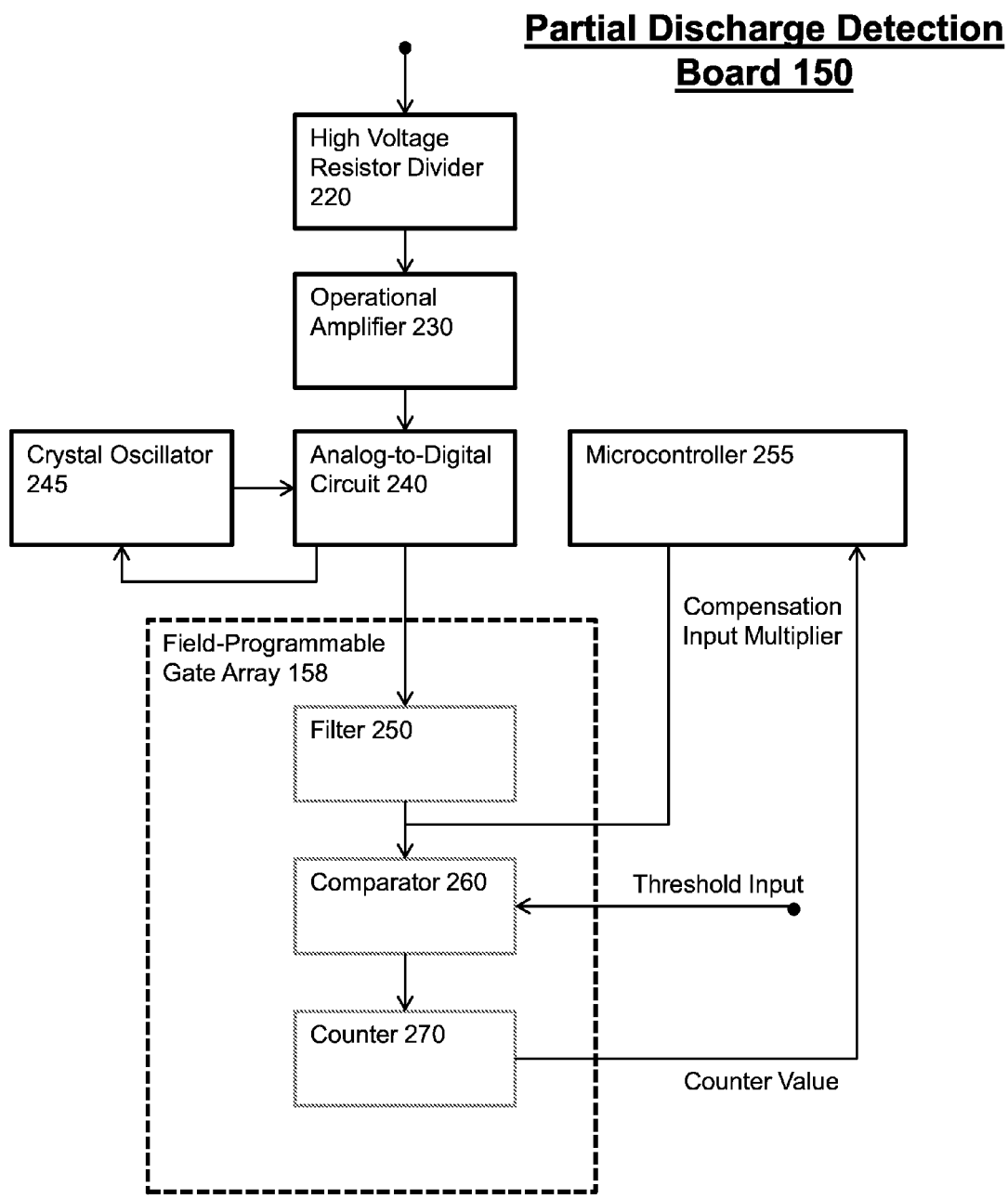
FIG. 2 is a schematic view of a partial discharge detection board of a system according to an embodiment of the present invention.

The partial discharge detection board 150 will now be described with respect to FIG. 2. In FIG. 2, a high voltage resistor divider 220 of the partial discharge detection board 150 receives an input signal, such as the reflective waveform. Upon receipt of a reflective waveform, the high voltage resistor divider 220 reduces the reflective waveform to a voltage level that is usable and safe for all the low voltage components of the partial discharge detection board 150. The voltage level (e.g., the level of attenuation) can also be determined by gain stages controlled by relays of the partial discharge detection board 150 (e.g., the partial discharge detection board 150 can include four gain stages to attenuate the reflective waveform). For instance, the partial discharge detection board 150 is configured to recognize if the reflective waveform is a signal that is too large for the low voltage components of the partial discharge detection board 150 and to automatically switch to between the gain stages to further attenuate the reflective waveform based on this recognition.

Next, an operational amplifier 230 (e.g., a unity gain operation amplifier) of the partial discharge detection board 150 acts as a buffer and isolates the reflective waveform from the rest of the partial discharge detection board 150. In turn, the operational amplifier 230 can provide an upper limit to the reflective waveform, such as by limiting the bandwidth to 235 MHz.

The reflective waveform is then passed to the analog-to-digital circuit 240 for analog-to-digital sampling. The analog-to-digital circuit 240 includes an analog-to-digital drive circuit and an analog-to-digital converter that together process the reflective waveform into a digital signal acceptable to the field-programmable gate array 158. Note that before the analog-to-digital sampling, a crystal oscillator 245 defines a sampling rate of the analog-to-digital circuit 240. To define the sampling rate, the crystal oscillator 245 by utilizes a mechanical resonance of a vibrating crystal to allow the analog-to-digital circuit 240 to recreate the reflective waveform in digital form at the resonance frequency of that crystal. Note that no filtering is performed before the analog-to-digital sampling. For example, all frequencies up to 235 MHz are conditioned by the crystal oscillator 245. Also, note that, at this stage, the partial discharge detection board 150 cannot distinguish between the frequency information other than magnitude due to signal aliasing above the Nyquist frequency (i.e., an upper limit of that frequency can be set out in a spectrum based on a sampling rate, such as half the sampling rate).

Once the reflective waveform is converted to the digital signal by the analog-to-digital circuit 240, the digital signal is passed to the field-programmable gate array 158. The field-programmable gate array 158 can include virtual components that implement the compensation heuristic, such as a filter 250, a microcontroller 255, a comparator 260, and a counter 270. The digital signal may be passed between the analog-to-digital circuit 240 and the field-programmable gate array 15 via a bus, such as a 12-bit bus.

Note that the digital signal that is passed to the field-programmable gate array 158 is dependent on a plurality of factors unique to a particular test being performed on the device 101. The plurality of factors is a set different gains and unknowns that yield different amplitudes of signals for the same waveform under different conditions. Examples of the plurality of factors may include a maximum voltage of the test being executed, a high voltage attenuation impedance (e.g., 100 kOhms for a 12 kV tester or below; 200 kOhms for a 15 kV tester), a gain of the low voltage stage of the divider (the gain is set by the field-programmable gate array 158 based on the overflow signal from the analog-to-digital converter), any inconsistencies between the items of the partial discharge detection board 150, etc.

The digital signal is noisy when it is passed to the field-programmable gate array 158. In turn, the filter 250 of the field-programmable gate array 158 isolates high frequency information of the noisy digital signal so that this high frequency information may pass through the field-programmable gate array 158 for further analysis. For example, with a 100 ns rise time with respect to the surge impulse, a radio frequency component ranging in the 20 Mhz to 235 Mhz range may pass through the field-programmable gate array 158 for further analysis. Further, by utilizing a digital 100-pole finite impulse response high pass filter with a cutoff frequency set to 20 MHz, as the filter 250, any waveforms ranging below 20 MHz) are completely eliminated.

After filtering, the field-programmable gate array 158 can utilize an input from the microcontroller 255 to normalize the digital signal received from the filter 250. The input can be a compensation input multiplier (also referred to as a compensation value) that is user defined during a calibration operation of the partial discharge detection board 150. The defining or setting of the compensation value multiplier during the calibration operation ensures that the millivolts of the partial discharge look the same across multiple host units, as further described below with respect to FIG. 3.

The field-programmable gate array 158 can further utilize the comparator 260 to check that levels of the digital signal, which is based on the compensation input multiplier of the microcontroller 255 being combined with the isolated high frequency information from the filter 250. The comparator 260 is configured to check the levels of the digital signal by comparing each level to a threshold input. When the comparator 260 determines that level of the digital signal exceeds the threshold input, the comparator 260 send a signal to the counter 270 of the field-programmable gate array 158 that causes the counter 270 to increments. Each increment corresponds to a detection of a partial discharge within the digital signal received from the filter 250. A value of the counter is a normalized amount that passed to the microcontroller 255 of the partial discharge detection board 150.

The microcontroller 255 provides the counter value (e.g., the normalized partial discharge signals) to a host controller unit for display. The host controller is a computing device including a display, a processor, and a memory and is configured to receive and display the normalized partial discharge signal. In this way, the field-programmable gate array 159 can provide the partial discharge signals to different host controller units that display the same values for the partial discharge information received, regardless of the type of controller unit.

Figure 3:
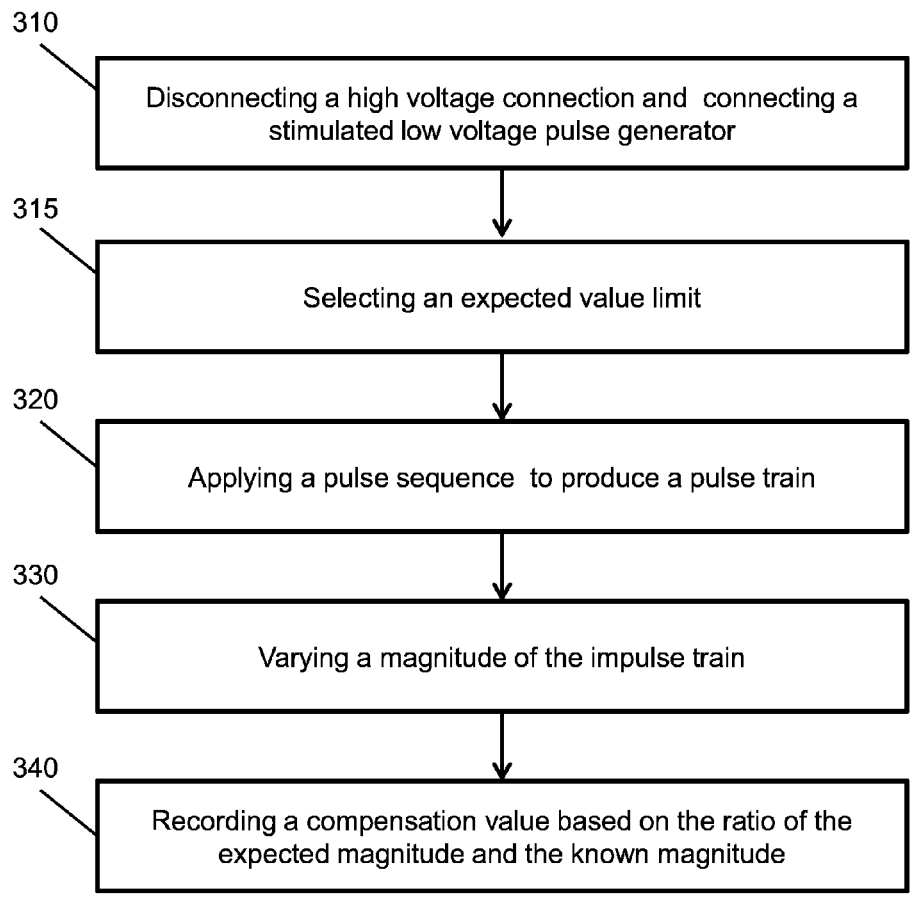
FIG. 3 is a process flow for calibrating a compensation value according to an embodiment of the present invention.

Turning now to FIG. 3, a process flow 300 for calibrating a compensation value (e.g., a calibration operation) is shown according to an embodiment of the present invention. The calibration operation, in general, includes setting the compensation value within a microcontroller of a partial discharge board 150 during manufacturing of the host unit 155.

The process flow 300 begins at block 310, where the partial discharge board 150 is disconnected from a high voltage connection and connected to a stimulated low voltage pulse generator. Next, at block 315, an expected value limit (e.g., 10 millivolts) is chosen and displayed as a horizontal line on a screen of the host unit 115. The expected value limit is the metric by which the compensation value is tuned.

Then, at block 320, a stimulated low voltage pulse generator (e.g., an external, calibrated, function generator external to the host unit 115) applies a pulse sequence that produces an impulse train through the partial discharge board 150. The pulse sequence can include rising and falling edge times that do not exceed a maximum frequency range of the partial discharge detection board 150 (e.g., utilizing a high bandwidth buffering amplifier set at 235 MHz). The pulse sequence can also include a variable magnitude as noted below.

Next, the process flow 300 continues to block 330, where the stimulated low voltage pulse generator varies a magnitude of the impulse train. For example, the stimulated low voltage pulse generator can increase the magnitude until a noticeable signal corresponding to the impulse train appears on the screen of the host unit 115. Further, once the repetitious pulses of the impulse train meet the expected value limit, a value identified/displayed on the screen (e.g., the 10 millivolts) is divided by a known magnitude of the impulse train generated by the stimulated low voltage pulse generator (e.g., 20 millivolts). Then, at block 340, the ratio of the value identified/displayed on the screen and the known magnitude of the impulse train is recorded as a compensation value (e.g., a ratio of 0.5). The field-programmable gate array 158 receives an input.

Once stored, the compensation value may be applied at each programmable gain stage (note that each stage may go through its own routine and may have its own compensation value) and to every waveform coming through the system 100. In this way, every time power is restored to the host unit 115, the compensation value is received by field-programmable gate array 158 as an input from the microcontroller of the host unit 115. Then, during customer testing, a threshold input is set according to a magnitude limit of the partial discharges that are considered significant (e.g., 15 millivolts). And, while every signal that passes through the host unit 115 is still multiplied by the stored compensation value, partial discharges that meet or exceed the threshold input (e.g., 15 millivolts) may be detected and displayed. For example, a maximum of a signal can always be displayed, regardless of whether that maximum exceeds the threshold input, while only those signals that exceed the threshold input can increment the counter though.

Thus, the compensation value can be used as a multiplier to ensure that the millivolts of the partial discharge look the same across multiple host units, such as 15 kV and lower host units, and/or across multiple gain stage settings, such as gain stage one or gain stage four. For example, when both a 15 kV host unit and a 4 kV host unit are used to detect partial discharges, corresponding compensation values (such as 0.2 and 5) are utilized to multiply the millivolts of the partial discharges so that the partial discharges look the same across these host units.

Technical effects and benefits of the above embodiments include enabling the setting of compensation regardless of the host unit type so that different host units can test for partial discharges and in turn display test results with the same values for the tested partial discharges. Further, the normalization of the test results enables variability in the attenuation circuit, which can reduce costs and material expenses for lower voltage application or application where both 15 kV and lower voltage host units are testing the same device.

The present invention may be a system, a method, and/or a computer program product. The computer program product may include a computer readable storage medium (or media) having computer readable program instructions thereon for causing a processor to carry out aspects of the present invention. The computer readable storage medium can be a tangible device that can retain and store instructions for use by an instruction execution device.

The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may include copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. In this way, the flowchart and block diagrams in the FIGS. illustrate the architecture, operability, and operation of possible implementations of systems, methods, and computer program products according to various embodiments of the present invention. Further, each block in the flowchart or block diagrams may represent a module, segment, or portion of instructions, which includes one or more executable instructions for implementing the specified logical operation(s). In some alternative implementations, the operations noted in the block may occur out of the order noted in the FIGS. For example, two blocks shown in succession may, in fact, be executed substantially concurrently, or the blocks may sometimes be executed in the reverse order, depending upon the operability involved. It will also be noted that each block of the block diagrams and/or flowchart illustration, and combinations of blocks in the block diagrams and/or flowchart illustration, can be implemented by special purpose hardware-based systems that perform the specified operations or acts or carry out combinations of special purpose hardware and computer instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the operations/acts specified in the flowchart and/or block diagram block or blocks. These computer readable program instructions may also be stored in a computer readable storage medium that can direct a computer, a programmable data processing apparatus, and/or other devices to operate in a particular manner, such that the computer readable storage medium having instructions stored therein includes an article of manufacture including instructions which implement aspects of the operation/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the operations/acts specified in the flowchart and/or block diagram block or blocks.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

The invention claimed is:

1. A field-programmable gate array for detecting and normalizing partial discharges in a digital signal, comprising:
   a filter configured to receive the digital signal and to isolate high frequency information from the digital signal, wherein the field-programmable gate array is configured to normalize the high frequency information by a compensation value to produce a normalized signal;
   a comparator configured to determine whether the normalized signal exceeds a threshold input; and
   a counter configured to increment a counter value in response to each determination that the high frequency information exceeds the threshold input,
   wherein the counter value corresponds to a number of the partial discharges detected within the digital signal.

2. The field-programmable gate array of claim 1, wherein the counter value is a normalized partial discharge signal that is passed by the field-programmable gate array to a host controller for display.

3. The field-programmable gate array of claim 1, wherein the high frequency information ranges from 20 MHz to 235 MHz.

4. The field-programmable gate array of claim 1, wherein the filter is a digital 100-pole finite impulse response high pass filter with a cutoff frequency set to 20 MHz.

5. The field-programmable gate array of claim 1, wherein the digital signal is received from an analog-to-digital circuit;
   wherein the digital signal results from a reflective waveform converted by the analog-to-digital circuit, and
   wherein the reflective waveform results from an impulse surge applied to a device.

6. The field-programmable gate array of claim 1, wherein a partial discharge detection board comprises the field-programmable gate array, and
   wherein the compensation value is defined during a calibration operation of the partial discharge detection board.

7. The field-programmable gate array of claim 1, wherein compensation value is based on a ratio between identified magnitude and a known magnitude.

8. A computer program product for detecting and normalizing partial discharges in a digital signal, the computer program product comprising a computer readable storage medium having program instructions embodied therewith, the program instructions executable by a field-programmable gate array to cause the field-programmable gate array to:
   receive the digital signal;
   isolate high frequency information from the digital signal;
   normalize the high frequency information by a compensation value to produce a normalized signal;
   determine whether the normalized signal exceeds a threshold input; and
   increment a counter value in response to each determination that the high frequency information exceeds the threshold input,
   wherein the counter value corresponds to a number of the partial discharges detected within the digital signal.

9. The computer program product of claim 8, wherein the counter value is a normalized partial discharge signal that is passed by the field-programmable gate array to a host controller for display.

10. The computer program product of claim 8, wherein the high frequency information ranges from 20 MHz to 235 MHz.

11. The computer program product of claim 8, wherein the digital signal is received from an analog-to-digital circuit;
    wherein the digital signal results from a reflective waveform converted by the analog-to-digital circuit, and
    wherein the reflective waveform results from an impulse surge applied to a device.

12. The computer program product of claim 8, wherein a partial discharge detection board comprises the field-programmable gate array, and
    wherein the compensation value is defined during a calibration operation of the partial discharge detection board.

13. The computer program product of claim 8, wherein compensation value is based on a ratio between identified magnitude and a known magnitude.

14. A host unit for detecting and normalizing partial discharges of a device under test, comprising:
    a surge board configured to apply an impulse surge to the device under test, wherein the impulse surge results in a reflective waveform received by the host unit; and
    a partial discharge detection board comprising:
        an analog-to-digital converter configured to process the reflective waveform into the digital signal, and
        a field-programmable gate array configured to:
            receive the digital signal,
            isolate high frequency information from the digital signal,
            normalize the high frequency information by a compensation value to produce a normalized signal,
            determine whether the normalized signal exceeds a threshold input, and
            increment a counter value in response to each determination that the normalized signal exceeds the threshold input,
    wherein the counter value corresponds to a number of the partial discharges detected within the digital signal.

15. The host unit of claim 14, wherein the counter value is a normalized partial discharge signal that is passed by the partial discharge detection board to a host controller for display.

16. The host unit of claim 14, wherein the high frequency information ranges from 20 MHz to 235 MHz.

17. The host unit of claim 14, wherein the compensation value is an input defined during a calibration operation of the partial discharge detection board.

18. The host unit of claim 14, wherein compensation value is based on a ratio between expected magnitude and a known magnitude of a control input signal provided to the partial discharge detection board during a calibration operation.

19. The host unit of claim 14, wherein the partial discharge detection board comprises:
    a high voltage resistor divider configured to receive and reduce the reflective waveform prior to the processing of the reflective waveform into the digital signal by the digital-to-analog converter.

20. The host unit of claim 14, wherein the partial discharge detection board comprises:
    an operational amplifier configured to provide an upper bandwidth limit of 235 MHz to the reflective waveform.

* * * * *